United States Patent [19]

Murase

[11] Patent Number: 5,436,489
[45] Date of Patent: Jul. 25, 1995

[54] FIELD EFFECT TRANSISTOR

[75] Inventor: Isao Murase, Itami, Japan

[73] Assignee: Mitsubishi Denki Kabushiki Kaisha, Tokyo, Japan

[21] Appl. No.: 214,301

[22] Filed: Mar. 17, 1994

[30] Foreign Application Priority Data

Mar. 24, 1993 [JP] Japan .................................. 5-064554

[51] Int. Cl.⁶ .................... H01L 29/48; H01L 29/56; H01L 29/64
[52] U.S. Cl. .................................. 257/401; 257/284; 257/344; 257/346; 257/402
[58] Field of Search .............. 257/401, 402, 344, 346, 257/408, 454, 900, 280, 284

[56] References Cited

U.S. PATENT DOCUMENTS

| | | | |
|---|---|---|---|
| 4,979,010 | 12/1990 | Brigayen | 257/900 |
| 5,220,186 | 6/1993 | Kasai et al. | 257/280 |
| 5,288,654 | 2/1994 | Kasai et al. | 437/41 |
| 5,358,885 | 10/1994 | Oku et al. | 437/39 |

FOREIGN PATENT DOCUMENTS

| | | | |
|---|---|---|---|
| 0490535 | 11/1991 | European Pat. Off. | |
| 61-144872 | 7/1986 | Japan | 257/412 |
| 3145738 | 6/1991 | Japan | |

OTHER PUBLICATIONS

Hosogi et al., "Photo/EB Hybrid Exposure Process For T-Shaped Gate Superlow-Noise HEMTs", Electronics Letters, vol. 27, No. 22, Oct. 1991, pp. 2011-2012.

Primary Examiner—Sara W. Crane
Assistant Examiner—Stephen D. Meier
Attorney, Agent, or Firm—Leydig, Voit & Mayer

[57] ABSTRACT

A field effect transistor includes a source electrode and a drain electrode disposed on a compound semiconductor substrate, a gate electrode having a T-shaped cross-section, and a gate pad having a T-shaped cross-section disposed at one side of the gate electrode, the gate electrode and the gate pad having a reinforcing thin metal film reinforcing the gate electrode on the rear surface of an overhanging portion of the head of the gate electrode and gate pad. Therefore, the head of the gate electrode is hardly ever separated from the leg of the gate electrode and a highly reliable T-shaped gate electrode is obtained. The gate electrode leg is produced using a thin film to which a pattern of the gate electrode is transcribed as a mask, thereby reducing the length of the head of the gate electrode. Accordingly, a T-shaped gate electrode is located in a deeper gate recess than ever without causing deterioration in the repeatability of its production.

9 Claims, 13 Drawing Sheets

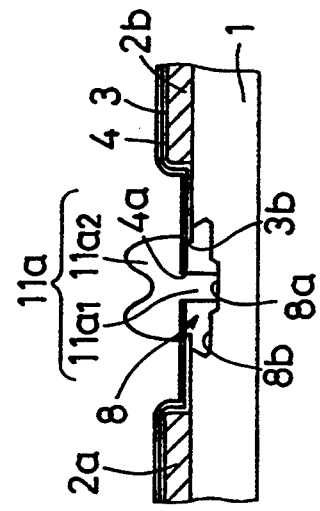
Fig. 3 (a)
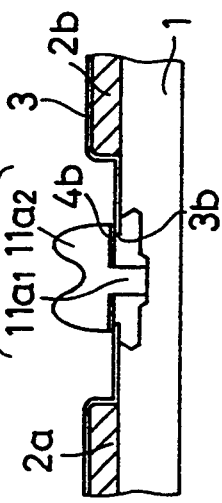
Fig. 3 (b)
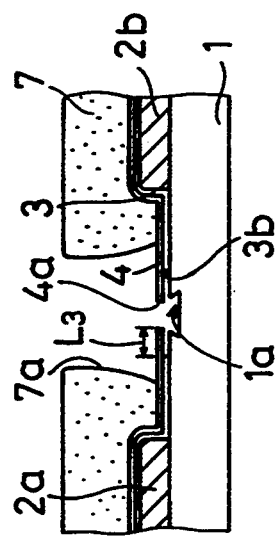
Fig. 3 (c)
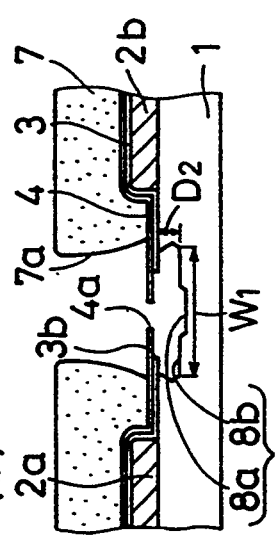
Fig. 3 (d)
Fig. 3 (e)
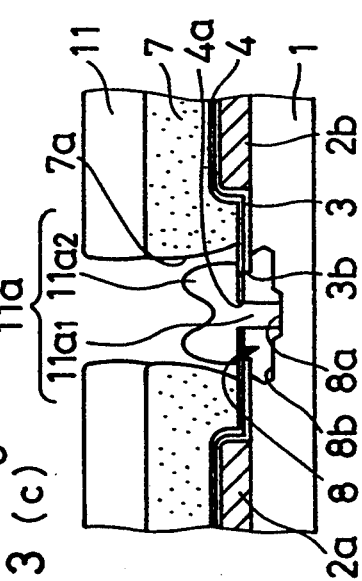
Fig. 3 (f)

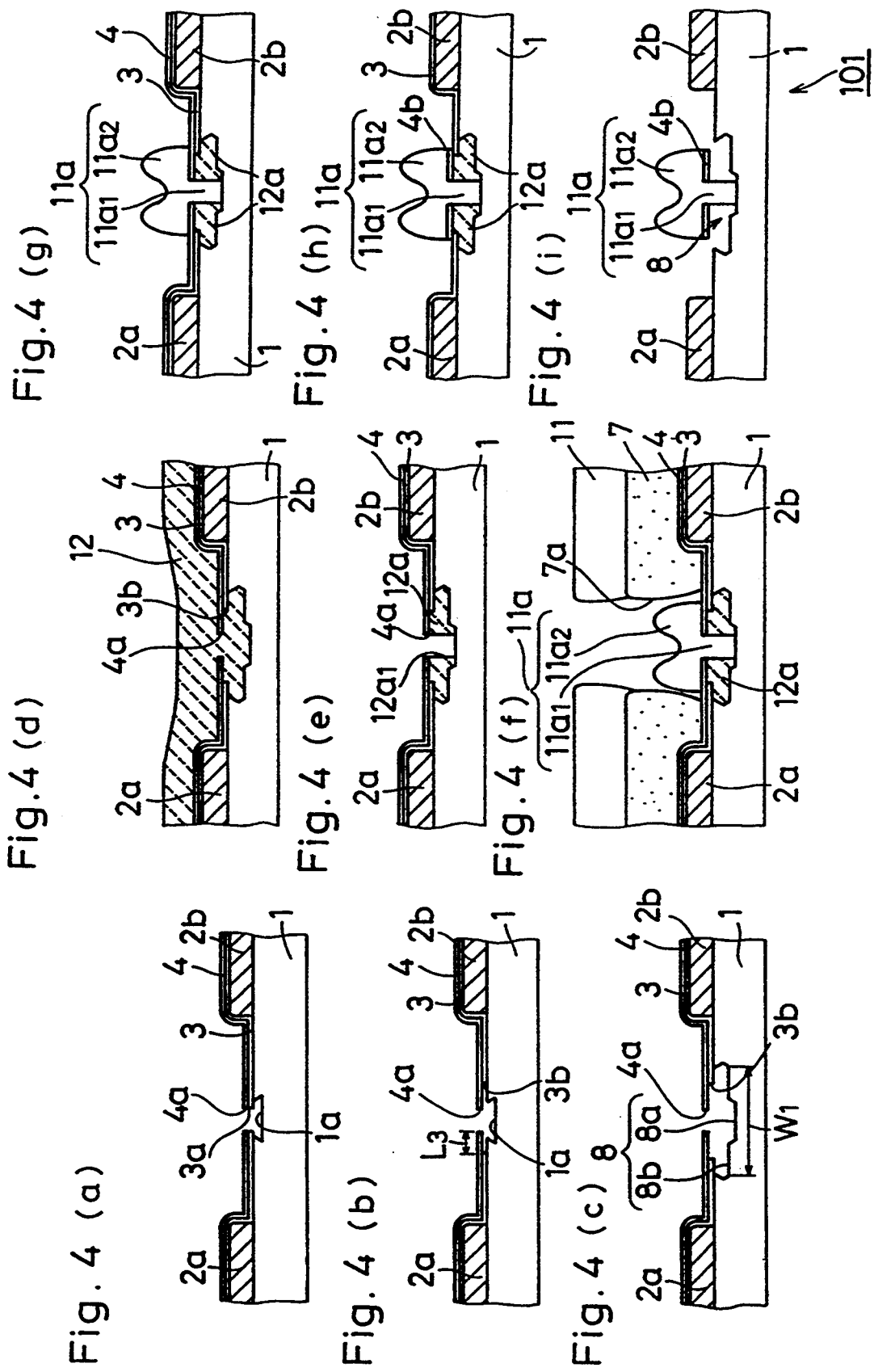

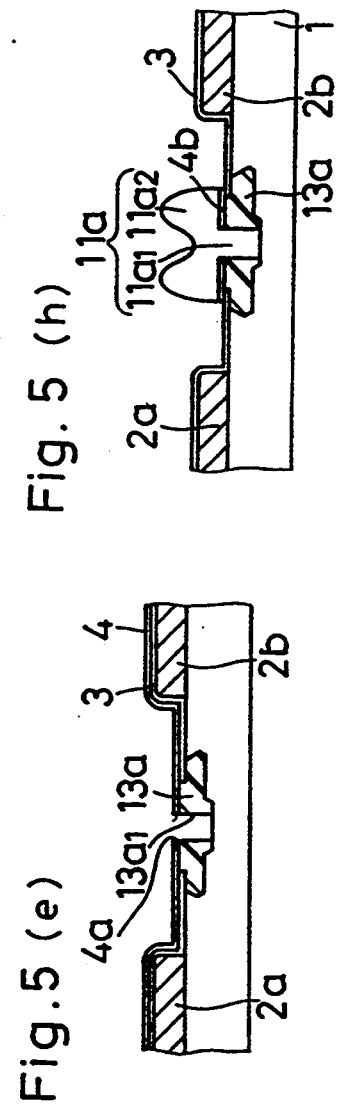 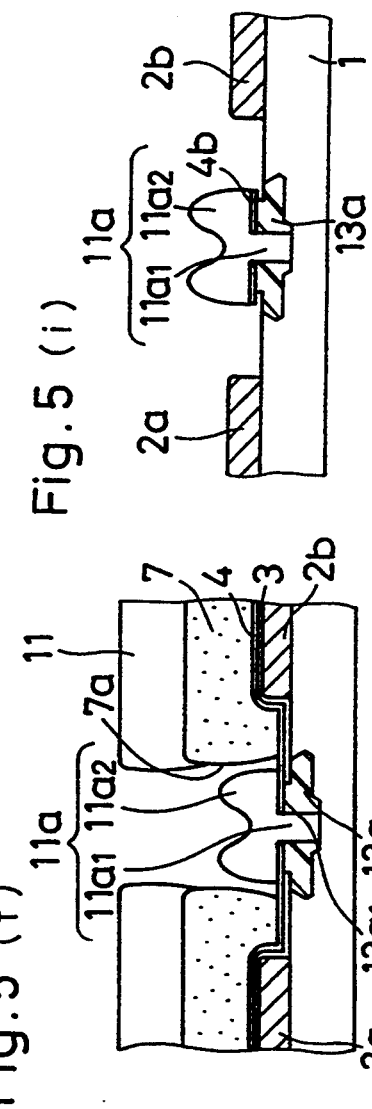 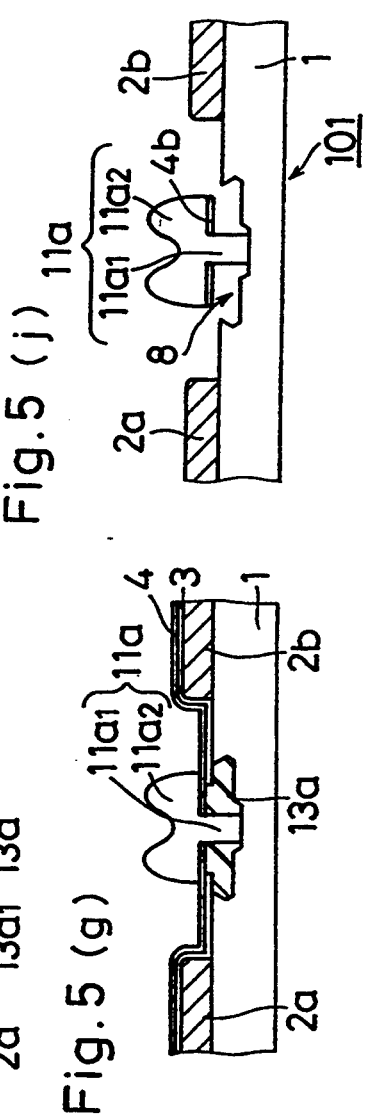

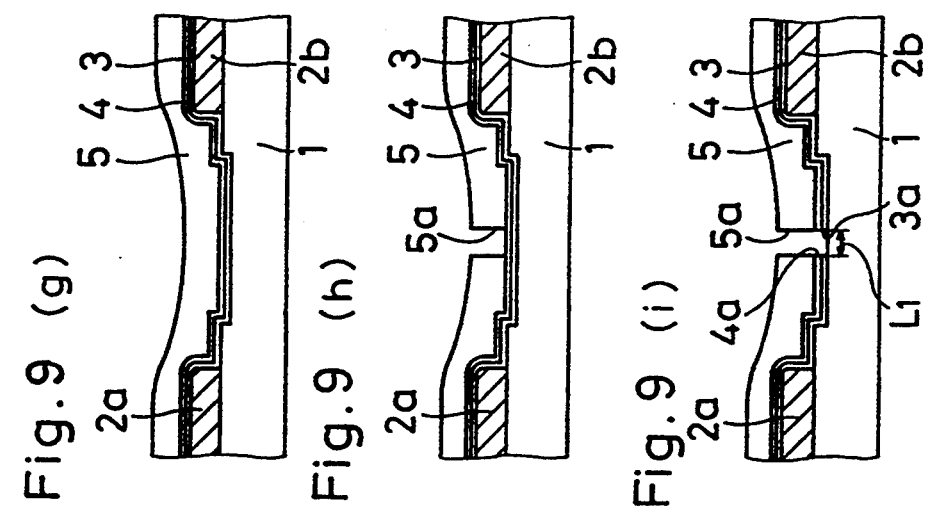

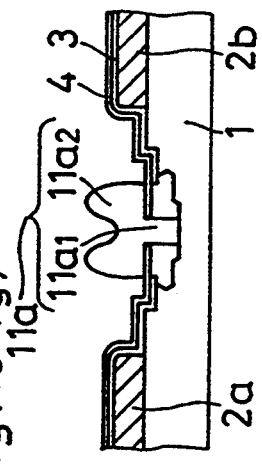
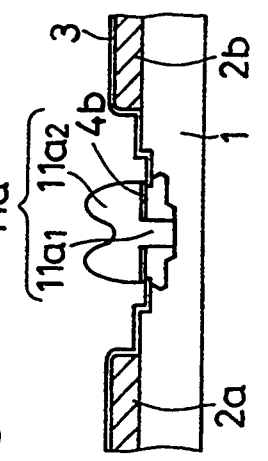
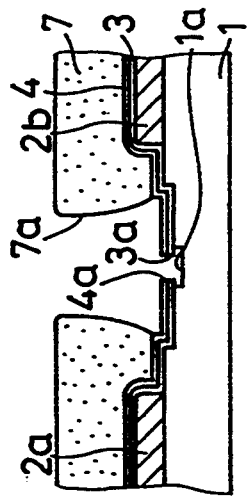
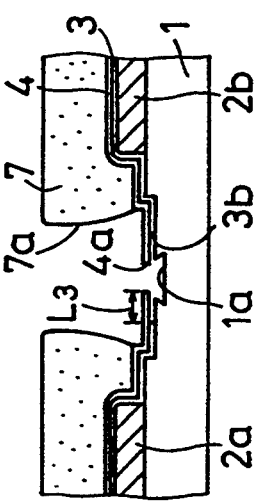
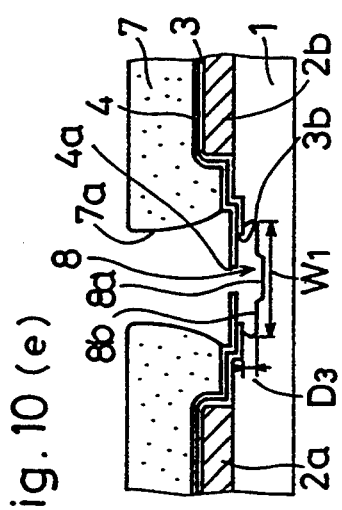
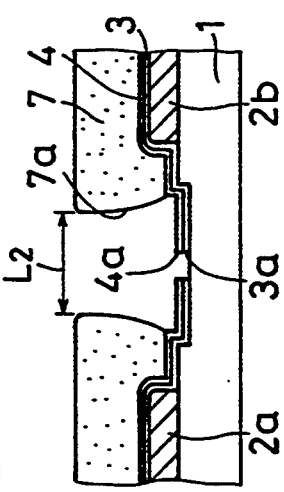
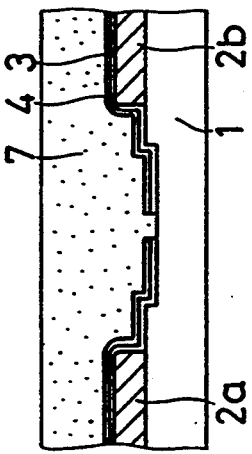

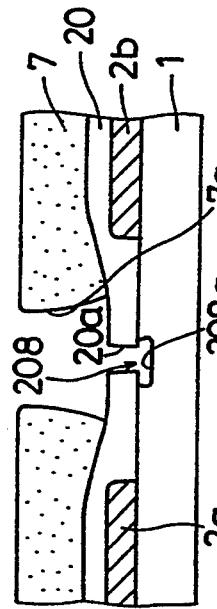
Fig. 12 (e)
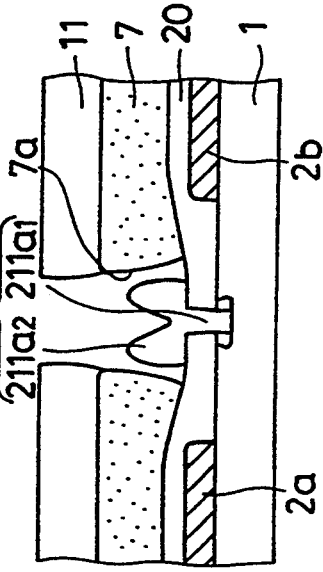
Fig. 12 (f)
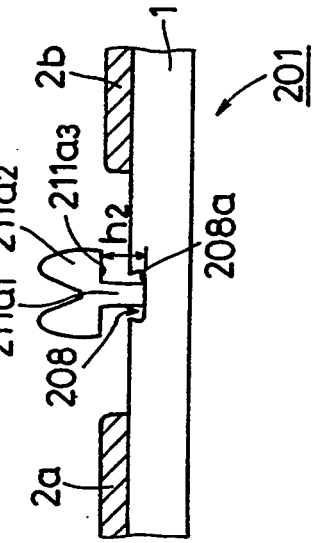
Fig. 12 (g)
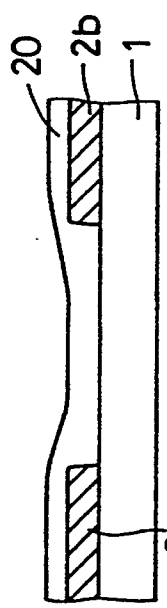
Fig. 12 (a) (Prior Art)
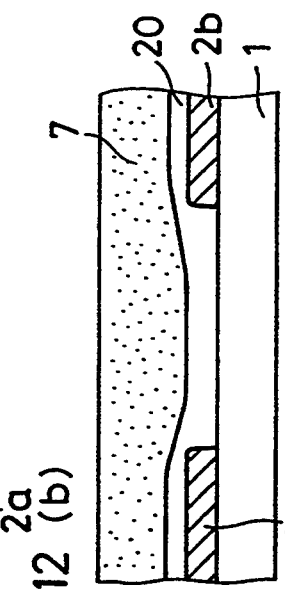
Fig. 12 (b)
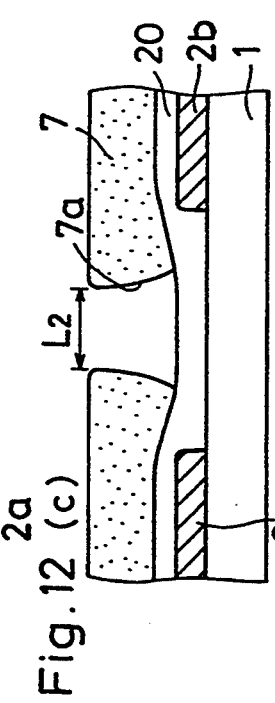
Fig. 12 (c)
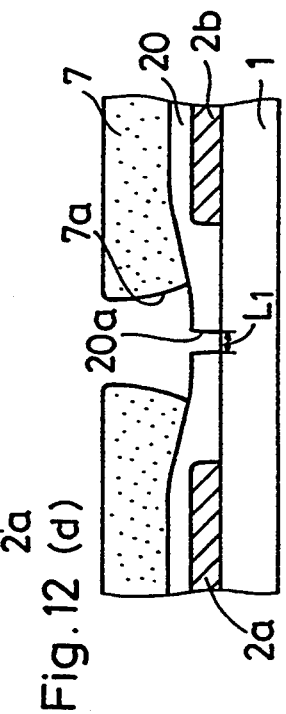
Fig. 12 (d)

Fig. 13      (Prior Art)
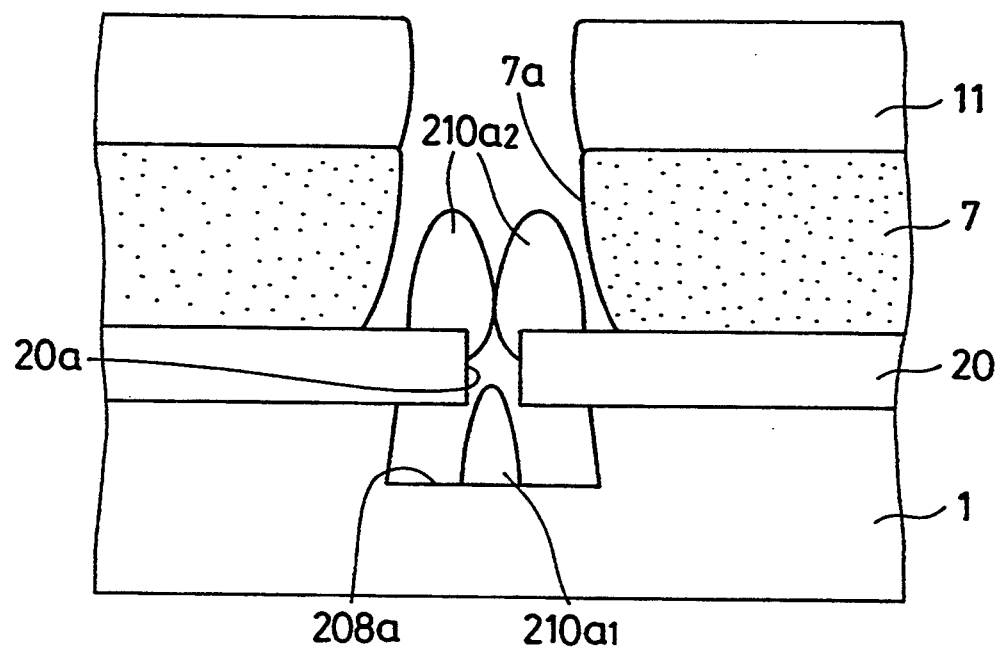

5,436,489

FIELD EFFECT TRANSISTOR

FIELD OF THE INVENTION

The present invention relates to a structure of a T-shaped gate electrode having a T-shaped cross-section for a field effect transistor (hereinafter also referred to as FET) and a production method thereof.

BACKGROUND OF THE INVENTION

In III-V series compound semiconductor FETs, the frequency band used is increased and accompanying therewith the required gate length is shortened from one-half μm to less than one-half half μm. Therefore, in an FET having a conventionally-used trapezoidal cross-section gate electrode an increase in gate resistance due to a reduction in gate cross-sectional area causes deterioration of FET characteristics. At present, therefore, an FET having a T-shaped gate electrode which a T-shaped cross-section is generally used that enables shortening and fine patterning of the gate length without causing a reduction in the cross-sectional area.

FIG. 11(a) is a plan view illustrating a semiconductor chip including a plurality of FET devices with such T-shaped gate electrodes. FIG. 11(b) is a cross-sectional view taken along line XIb—XIb of FET device mounted on the semiconductor chip shown in FIG. 11(a).

In FIGS. 11(a) and 11(b), reference numeral 200 designates a semiconductor chip including a plurality of FET devices 201, each having a T-shaped gate electrode 211a. Source electrodes 2a and drain electrodes 2b are disposed on the GaAs substrate 1 alternatingly with a predetermined distance $L_E$ (about 3 μm) therebetween. A gate recess 208 having a depth DR of 1000 to 1500 Å and a width WR is located at a predetermined part of each region on the surface of the GaAs substrate 1 between each adjacent source electrode 2a and drain electrode 2b. A gate pad 211b is disposed in the vicinity of the source electrodes 2a and the drain electrodes 2b along the direction of these electrodes.

Fine line patterns 211a extending from the gate pad 211b are disposed at each region between each adjacent source electrode 2a and each drain electrode 2b parallel to these electrodes, and these fine line portions 211a serve as the gate electrodes. Both the source electrode 2a and the drain electrode 2b comprise AuGe alloy, while the gate electrodes 211a and the gate pad 211b is a double-layer structure comprising a lower Ni layer and an upper Al layer.

Both gate electrode 211a and gate pad 211b have a T-shaped cross-section. The gate electrode 211a comprises a gate electrode leg part $211a_1$ having a width LG1 smaller than the recess width WR that contacts a bottom surface 208a of the gate recess 208, and a gate electrode head part $211a_2$ having a width LG2 larger than the gate recess width WR, as shown in FIG. 11(b). Similarly, the gate pad 211b (not shown in the figure) comprises a leg part and a head part. The width LG1 of the gate electrode leg part $211a_1$, equivalent to the gate length, is 0.25 μm. The width LG2 of the gate electrode head part $211a_2$ is about 1 μm.

Next, an explanation is given of a method of producing the FET device 201.

FIGS. 12(a) to 12(g) are drawings for explaining main process steps of producing a T-shaped gate electrode employing a conventional double-layer resist method. Each figure illustrates a cross-section of an FET device 201 taken along line XIb—XIb shown in FIG. 11(a).

In the figures, reference numeral 20 designates a resist film exposed by an electron beam (hereinafter referred to as an EB resist film). The resist film 20, having a resist aperture 20a on a part of GaAs substrate 1 where the gate electrode 211a is to be produced, determines a position of a gate electrode leg part $211a_1$, and also acts as a mask for producing the gate electrode 211a. Reference numeral 7 designates a resist film exposed by light, such as a resist film for light rays (hereinafter referred to as a photoresist film). The resist film 7 has a resist aperture 7a which is wider than the aperture 20a and includes the aperture 20a of the EB resist film 20 to determine the position of a gate electrode head part $211a_2$, and also acts as a mask for producing the gate electrode 211a. An image reversal resist film is adopted as the resist film 7 because the cross-sections of facing opposite surfaces thereof exposed in the aperture 7a are overhanging configurations which are appropriate for being lifted-off.

At first, as shown in FIG. 12(a), a source electrode 2a and a drain electrode 2b each about 3000 Å thick are produced on a GaAs substrate 1 with an interval about 3 μm therebetween, and then an EB resist film 20 is applied to the entire surface in a thickness of about 2000 Å at the flat part thereof on the source and drain electrodes.

Next, a photoresist film 7 is applied to a thickness of about 1.5 μm on the EB resist film 20 as shown in FIG. 12(b). Subsequently, the photoresist film 7 is patterned to form a resist aperture 7a on a part of GaAs substrate 1 where the gate electrode 211a is to be produced as shown in FIG. 12(c). The width L2 of the resist aperture 7a is, for example, about 1 μm, and determines the width of the head part $211a_2$ of the gate electrode 211a which is produced in a later process step.

Thereafter, a predetermined portion of the EB resist film 20 exposed in the aperture 7a of the photoresist film 7 is patterned with an electron beam and developed to form an EB resist aperture 20a as shown in FIG. 12(d). Then, the width L1 of the EB resist aperture 20a is 0.25 μm and determines the width of the leg part $211a_1$ of the gate electrode 211a, i.e., the gate length of the FET device 201.

The semiconductor substrate 1 is selectively etched with tartaric acid using the EB resist film 20 as a mask to form a gate recess 208 about 1000 to 1500 Å deep as shown in FIG. 12(e).

Next, for example, Ni and Al as gate metals 11 (gate electrode materials), are successively evaporated on the entire surface in the thickness of 1000 Å and 8000 Å, respectively, to produce a T-shaped gate electrode 211a in the aperture 7a of the resist film 7 as shown in FIG. 12(f). The position of the gate electrode leg part $211a_1$ is determined by the EB resist film 20 and the position of the gate electrode head part $211a_2$ is determined by the photoresist film 7.

Finally, the gate electrode materials 11 on the photoresist film 7 are lifted-off by removing the photoresist film 7, and the EB resist film 20 thereunder is removed to complete the FET device 201 as shown in FIG. 12(g).

Here, the height h2 from the recess bottom surface 208a to the lower surface $211a_3$ of overhanging portion of the gate electrode head part $211a_2$ amounts to a sum of the depth DR of the gate recess 208 and the thickness of the EB resist film 20, that is about 4000 to 4500 Å. This is because, although the EB resist film 20 is applied in the thickness of 2000 Å at the flat portion on the source and drain electrodes, the EB resist film is about 3000 Å thick on a part of the GaAs substrate 1 where the gate electrode 211a is to be disposed due to the level differences between the source and drain electrodes and the substrate.

There is a problem in the conventional T-shaped gate electrode 211a, however, that since the wide gate electrode head part 211$a_2$ is produced on the narrow gate electrode leg part 211$a_1$, the gate electrode head part 211$a_2$ tends to be separated from the leg part 211$a_1$ when external mechanical force is applied to the head part 211$a_2$.

In addition, in the conventional method of producing the T-shaped gate electrode, the ratio L1/h2, that is, the ratio of the width L1 of the EB resist aperture 20a, which is almost equal to the gate length LG1, to the height h2, from the recess bottom surface 208a to the lower surface 211$a_3$ of overhanging portion of the gate electrode head part 211$a_2$, is restricted. When the ratio is smaller than $\frac{1}{2}$, it is difficult to connect the T-shaped gate electrode head part 211$a_2$ with the leg part 211$a_1$. Therefore, the conventional process is not applicable to an FET device including a deep recess.

To be more specific, as shown in FIG. 13, in producing an FET device 201 including a deep gate recess 208, when gate electrode materials 11 are evaporated, a gate electrode leg part 210$a_1$, which is under the surface of the EB resist film 20, is not connected to a gate electrode head part 210$a_2$, which is placed on the EB resist film 20, so that a T-shaped gate electrode is hardly realized.

Further, although a T-shaped gate electrode can be produced by adopting a thin EB resist film 20 in an FET device including a deep gate recess 208, since the EB resist film 20 is deposited on the entire surface by spin-coating, if the EB resist film is extremely thin, the EB resist film does not completely cover the entire surface, resulting in disadvantages in the production process. In addition, it takes a long time to transcribe a pattern of the gate electrode leg part to the EB resist film 20 with an electron beam, resulting in a low throughput.

Japanese Patent Published Application Hei. 3-145738, discloses a method for producing a semiconductor device including an offset gate in which a gate electrode pattern is transcribed to a WSi thin film and then a gate recess is formed using the patterned WSi thin film as a mask. In this production process of the FET device, although a WSi thin film thinner than the EB resist film is adopted as a patterning mask, the WSi thin film is used as a mask in forming a gate recess while a resist film is used as a mask for producing a gate electrode. Therefore, the production method disclosed in this prior art cannot solve the above-described problem in producing an FET device including a deep gate recess in which a T-shaped gate electrode is formed.

SUMMARY OF THE INVENTION

An object of the present invention is to provide a semiconductor device including a T-shaped gate electrode in which the detachment of the T-shaped gate electrode head part from the leg part hardly occurs.

Another object of the present invention is to provide a method of producing a semiconductor device in which a T-shaped gate electrode is applicable to an FET device including a deep gate recess without causing loss of repeatability.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to a first aspect of the present invention, a semiconductor device includes a gate electrode having a fine straight line of a T-shaped cross-section constituting an FET device, a gate pad having a T-shaped cross-section for wiring, integrally produced with the gate electrode and disposed at one side of the gate electrode, the gate electrode and the gate pad having a reinforcing thin film reinforcing the fine gate electrode, integrally formed at the rear surface side of overhanging portion of the gate electrode head part and the gate pad head part. Therefore, the mechanical strength at the junction of the gate electrode head part with the gate electrode leg part is increased, and the head part is hardly separated from the leg part, resulting in an improved reliability FET device.

According to a second aspect of the present invention, a production method of a semiconductor device comprises producing a source electrode and a drain electrode on a semiconductor substrate, depositing first and second thin films comprising different kinds of materials having high mechanical strength relative to a resist material on the entire surface successively, forming apertures in portions of the first and the second thin films, respectively, corresponding to a part of the semiconductor substrate surface where a gate electrode is to be produced, forming a resist film so that a resist aperture therein includes apertures in both thin films, selectively etching the semiconductor substrate surface using the first thin film as a mask to form a gate recess having a width wider than the aperture of the first thin film, and producing a gate electrode of a T-shaped cross-section using the second thin film and the resist film as masks. Since the T-shaped gate electrode leg part is formed using the thin films as masks, the length of the gate electrode leg part, equal to the depth of the gate recess and the sum of the thickness of the thin films, is decreased. Therefore, a T-shaped gate electrode is applicable to an FET device including a deep gate recess.

According to a third aspect of the present invention, a method of producing a semiconductor device comprises, after forming the resist film, depositing gate electrode materials on the entire surface to produce a leg part of a T-shaped gate electrode using the second thin film as a mask, and, to produce a head part of a T-shaped gate electrode, using the resist film as a mask.

According to a fourth aspect of the present invention, a method of producing a semiconductor device comprises transcribing a pattern of the T-shaped gate electrode leg part to a resist film by a phase shift method, so that an EB resist film, which is exposed by patterning with an electron beam, is not required, resulting in an improved throughput.

According to a fifth embodiment of the present invention, a method of producing a semiconductor device comprises evaporating and lifting-off gate electrode materials to produce a gate electrode of a T-shaped cross-section, and then selectively removing the second thin film so that part of the second thin film adhering to the rear surface side of the overhanging portion of the gate electrode head part remains. Thus, the reinforcing thin film reinforcing the fine gate electrode is formed from the thin film which is used as a mask for producing the gate electrode leg part.

According to a sixth aspect of the present invention, a method of producing a semiconductor device comprises, after forming a gate recess, forming a buried layer by filling the gate recess with an insulating material, etching the buried layer using the second thin film as a mask, evaporating and lifting-off gate electrode material to produce a gate electrode, and removing the buried layer. Thus, an inner surface of the gate recess is prevented from being damaged in a process step of removing the second thin film.

According to a seventh aspect of the present invention, in a method of producing a semiconductor device, the filling of the gate recess with an insulating material is performed by spin-coating a liquid silica system compound, so that when a resist material is deposited and developed in a later process step, the insulating material filling the gate recess has no possibility of being dissolved with a solvent for the resist film.

According to an eighth aspect of the present invention, in a method of producing a semiconductor device, the filling of the gate recess with an insulating material is performed by depositing a photoresist material, so that the filled resist layer can be patterned by photolithography using the second thin film as a mask. Therefore, opposite facing surfaces of the patterned filled resist layer in the gate recess are perpendicular to the substrate surface.

According to a ninth aspect of the present invention, a semiconductor device includes a T-shaped cross-section gate electrode in which a lower half of the head part and the leg part comprise a refractory metal silicide and an upper half of the head part comprises a low resistance metal.

According to a tenth aspect of the present invention, a method of producing a semiconductor device comprises, in place of evaporating and lifting-off gate electrode material as described above, depositing WSi or WSiN on the entire surface as a gate electrode material by sputtering, and selectively etching the gate electrode material using a resist film as a mask to produce a gate electrode. In this way, narrow apertures of the first and the second thin films are completely filled with the gate electrode material.

According to an eleventh aspect of the present invention, a production method of a semiconductor device comprises producing a source electrode and a drain electrode on a semiconductor substrate, forming a wide recess wider than the T-shaped gate electrode head part in a region of the semiconductor substrate surface between the source and the drain electrodes, depositing first and second thin films comprising different kinds of materials having a high mechanical strength relative to a resist material on the entire surface successively so that the concave shape of the wide recess is observed at the surface, patterning the second and the first thin films, forming a gate recess having a width wider than the aperture of the first thin film using the first thin film as a mask in a predetermined part of the semiconductor substrate surface, and producing a gate electrode having a T-shaped cross-section using the second thin film and the resist film, which is produced so that a resist aperture therein includes apertures of the both thin films, as masks. In short, since the gate recess is formed in the wide recess, the distance from a top surface of the substrate to the bottom surface of the gate recess is increased by a depth of the wide recess. In this way, a T-shaped gate electrode is realized in an FET device in which a bottom surface of a gate recess is deeply located relative to the top surface of the substrate.

BRIEF DESCRIPTION OF THE DRAWINGS

FIGS. 3(a) to 3(f) are cross-sectional views illustrating process steps for producing a gate recess and a gate electrode in a method of producing an FET device in accordance with the first embodiment of the present invention.

FIGS. 4(a) to 4(i) are cross-sectional views illustrating another method of producing an FET device as a second embodiment of the present invention.

FIGS. 5(a) to 5(j) are cross-sectional views illustrating another method of producing an FET device as a third embodiment of the present invention.

FIGS. 9(a) to 9(i) are cross-sectional views illustrating process steps for producing a layer used as a mask when gate electrode materials are deposited in the method of producing the semiconductor device in accordance with the fifth embodiment.

FIGS. 10(a) to 10(i) are cross-sectional views illustrating process steps for producing a gate recess and a gate electrode in the method of producing the semiconductor device in accordance with the fifth embodiment.

FIGS. 12(a) to 12(g) are cross-sectional views illustrating main process steps in a prior art method of producing an FET device.

FIG. 13 is a cross-sectional view for explaining a problem in the prior art method of producing an FET device with a T-shaped gate electrode.

DETAILED DESCRIPTION OF THE PREFERRED EMBODIMENTS

Embodiment 1.

Figure 1:
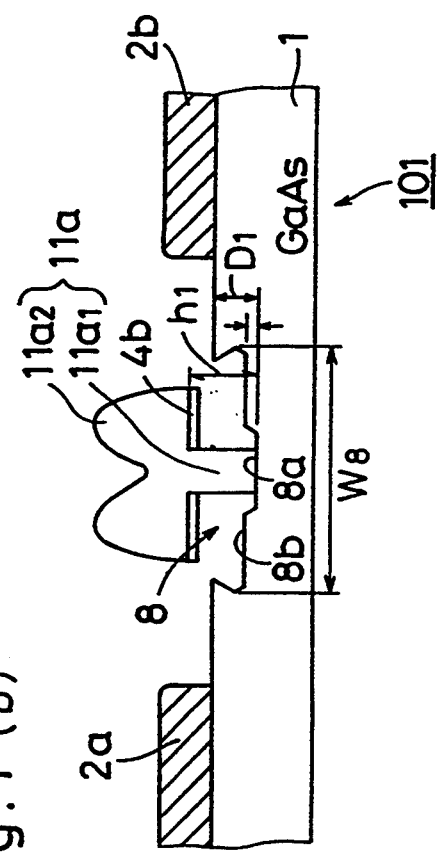
FIG. 1(a) is a plan view illustrating a semiconductor chip as a semiconductor device and a structure of an FET device with a T-shaped gate electrode mounted on the semiconductor chip in accordance with a first embodiment of the present invention.
figures 1(b) and 1(c) are cross-sectional views illustrating cross-sections of the device of FIG. 1(a) taken along lines 1b–1b and 1c–1c, respectively.
Figure 1:
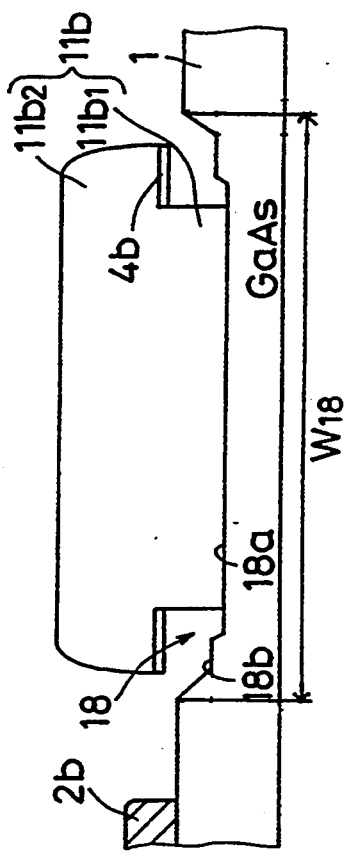
Figure 1:
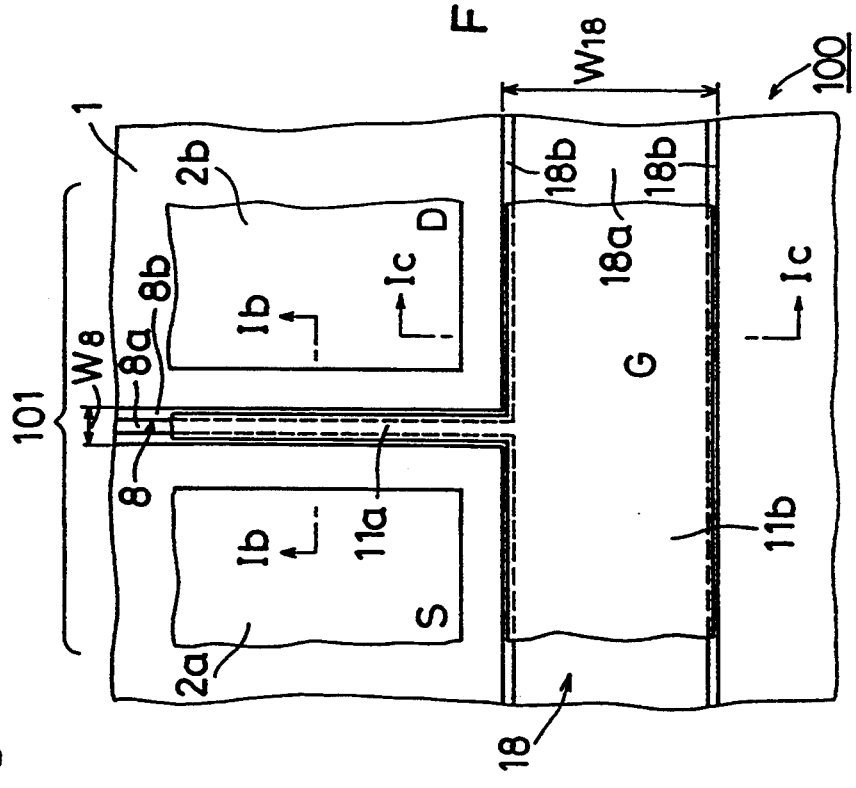

FIG. 1(a) is a plan view illustrating a semiconductor device, in accordance with a first embodiment of the present invention. FIG. 1(b) is a cross-sectional view illustrating the structure of the FET device shown taken along figure 1(a) in line Ib—Ib, and figure 1(c) is a cross-sectional view illustrating the FET device shown in figure 1(b) taken along line Ic—Ic. FIGS. 2(a) to 2(i) and FIGS. 3(a) to 3(f) are cross-sectional views illustrating main process steps in a method of producing the semiconductor device.

Figure 11:
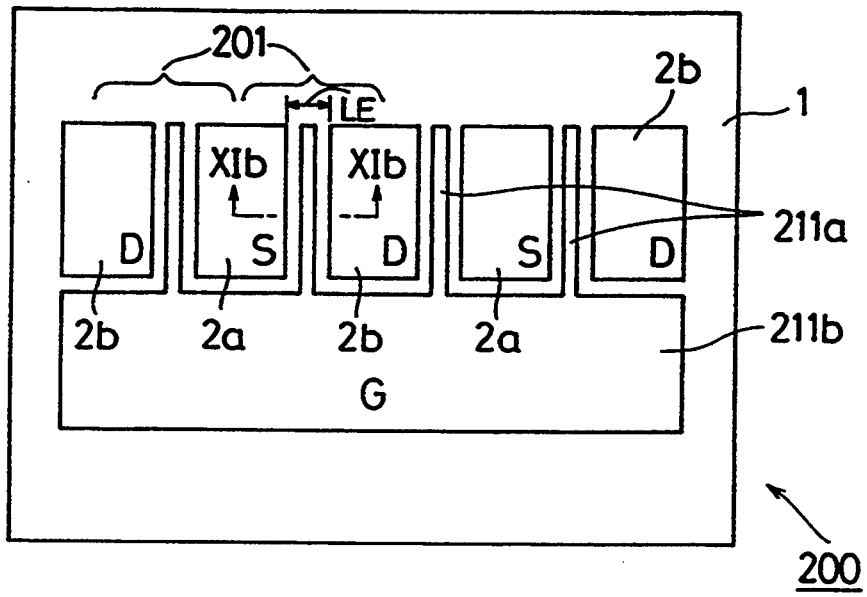
FIG. 11(a) is a plan view illustrating a prior art semiconductor chip and FIG. 11(b) is a cross-sectional view illustrating a structure of an FET device with a T-shaped gate electrode according to the prior art.
Figure 11:
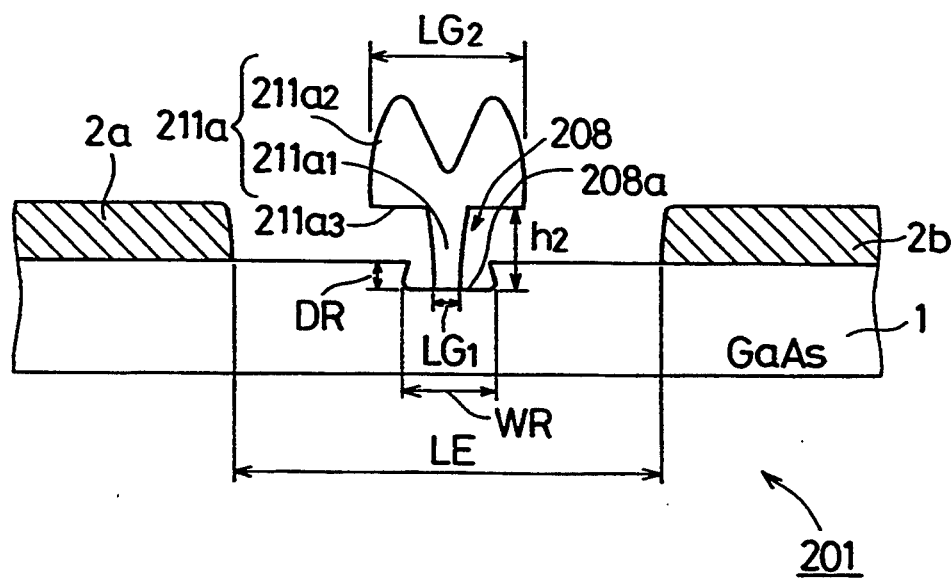

In the figures, the same reference numerals as those in FIGS. 11(a) and 11(b) designate the same or corresponding elements as those in the conventional semiconductor chip 200. Reference numeral 100 designates a semiconductor chip of this first embodiment. A plurality of FET devices 101 each having a T-shaped gate electrode 11a are located on a GaAs substrate 1.

In a region between adjacent source electrode 2a and drain electrode 2b on a surface of the GaAs substrate 1, a gate recess 8, having a width represented as W8, is located In the vicinity of the source electrode 2a and the drain electrode 2b, a gate pad recess 18 (having a width represented as W18), which is connected to the gate recess 8, is located perpendicular to the direction of these recesses 8. A gate electrode 11a is disposed in the gate recess 8, and a gate pad 11b is disposed in the gate pad recess 18. Each of the recesses 8 and 18 has a two-stage recess structure, comprising first bottom surfaces 8a and 18a and second bottom surfaces 8b and 18b, respectively placed at both sides of first bottom surfaces 8a and 18a, higher than the first bottom surfaces 8a and 18a nor not in contact with the gate electrode 11a and the gate pad 11b.

Each of the gate electrode 11a and the gate pad 11b has a T-shaped cross-section. The gate electrode 11a comprises a fine leg part 11a₁, disposed on the first bottom surface 8a of the gate recess 8, and a wide head part 11a₂ placed on the leg part 11a₁ as shown in FIG. 1(b). The gate pad 11b comprises a leg part 11b₁ disposed on the first bottom surface 18a of the gate pad recess 18 and a head part 11b₂ placed on the leg part 11b₁ and wider than the leg part 11b₁. A width L1 of the leg part 11a₁ of the gate electrode 11a, equivalent to a gate length, is 0.3 μm. A width L2 of the head part 11a₂ of the gate electrode 11a is about 1.5 μm.

Reinforcing thin film 4b, comprising WSi and reinforcing the gate electrode head part 11a₂, is located at the rear surface side of the overhanging portion of the gate electrode head part 11a₂ and the gate pad head part 11b₂.

In FIGS. 2(a) to 2(i) and 3(a) to 3(f), reference numeral 3 designates an SiN thin film 500 Å thick used as a mask in forming a gate recess 8. Reference numeral 3a designates an SiN thin film aperture for forming a etched recess portion 1a. Reference numeral 3b designates an SiN thin film enlarged aperture for forming a gate recess 8. A WSi thin film 4 500 Å thick has an aperture 4a for determining the position of a leg part 11a₁ of the T-shaped gate electrode 11a. A photoresist film 5 is used for patterning the WSi thin film 4 and the SiN thin film 3. A resist aperture 5a is formed at a place where the gate electrode is to be produced. A photoresist film 7 1.5 μm thick, comprising an image reversal resist, has a photoresist aperture 7a for determining the position of a head part 11a₂ of the T-shaped gate electrode 11a. Reference numeral 11 designates gate electrode materials formed by evaporating Ti and Au in thicknesses of 1000 Å and 8000 Å, respectively.

Next, a production method of the FET device is described.

Figure 2:
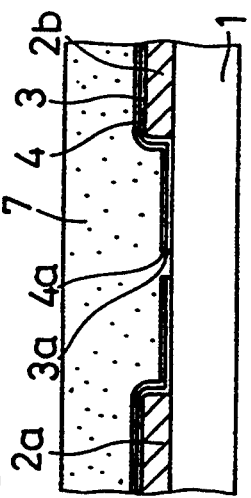
FIGS. 2(a) to 2(i) are cross-sectional views illustrating process steps for forming a layer which is used as a mask when gate electrode materials are deposited in a method of producing the FET device in accordance with a first embodiment of the present invention.
Figure 2:
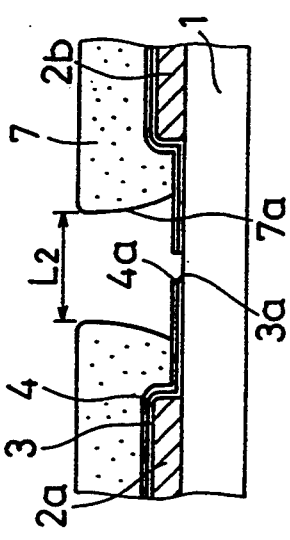
Figure 2:
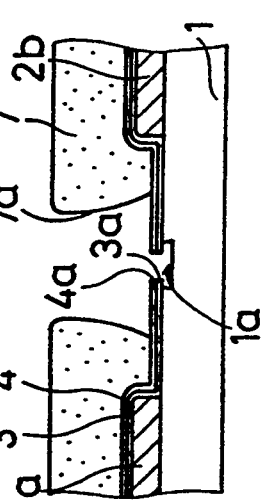
Figure 2:
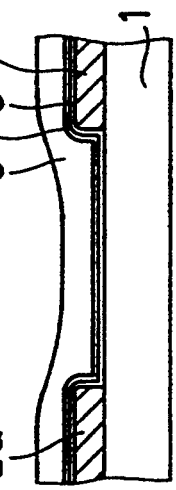
Figure 2:
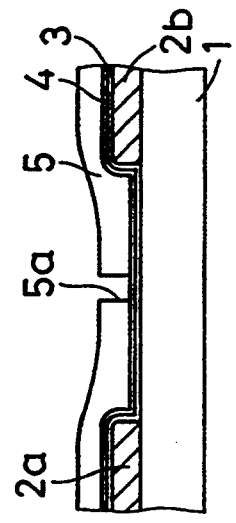
Figure 2:
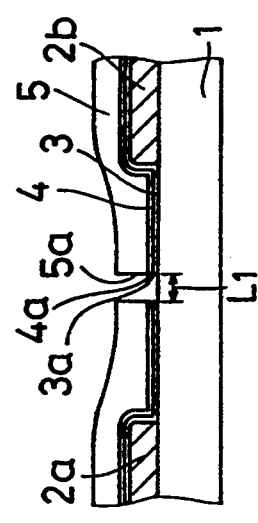
Figure 2:
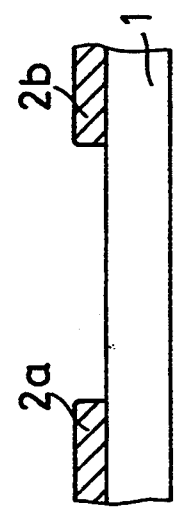
Figure 2:
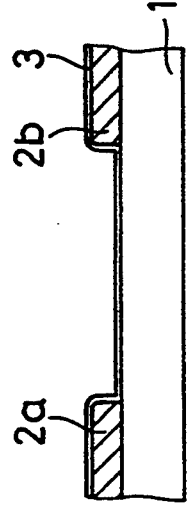
Figure 2:
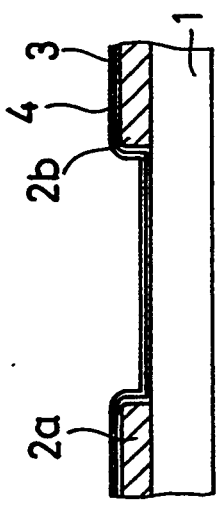

First, as shown in FIG. 2(a), a source electrode 2a and a drain electrode 2b are produced with a prescribed distance therebetween on a GaAs substrate 1. Then, an SiN thin film 3 500 Å thick is deposited on the entire surface by a CVD method as shown in FIG. 2(b), and subsequently a WSi thin film 4 500 Å thick is deposited on the entire surface of the SiN thin film 3 by sputtering as shown in FIG. 2(c).

Next, a photoresist film 5 is deposited on the entire surface of the WSi thin film 4 as shown in FIG. 2(d). The i ray resist film 5 is patterned to form a resist aperture 5a in a region where a leg part 11a₁ of a T-shaped gate electrode 11a is to be produced as shown in FIG. 2(e). The width L1 of the resist aperture 5a is the gate length of the FET device. A pattern of the resist aperture 5a is transcribed on the photoresist film 5 by a phase shift method, and the aperture width L1 is 0.3 μm.

Thereafrer, the WSi thin film 4 and the SiN thin film 3 are successively patterned by RIE (reactive ion etching) using the photoresist film 5 as a mask to form a WSi thin film aperture 4a and a SiN thin film aperture 3a as shown in FIG. 2(f). Then, the WSi thin film 4 is etched with a mixture of $SF_6$ and $CHF_3$, and the SiN thin film 3 is etched with a mixture of $CHF_3$ and $O_2$.

Subsequently, after the photoresist film 5 is removed, a photoresist film 7 is deposited by applying an image reversal resist in the thickness of 1.5 μm as shown in FIG. 2(g). A resist aperture 7a having a width L2 of about 1.5 μm is formed by photolithography between a source electrode and a drain electrode where a gate electrode 11a is to be produced as shown in FIG. 2(h). Then, the resist aperture 7a is formed to include the WSi thin film aperture 4a at its center, and the aperture width L2 is the width of the head part 11a₂ of the T-shaped gate electrode 11a.

A part of the surface of a semiconductor substrate 1 exposed in the SiN thin film aperture 3a is wet-etched with tartaric acid in aqueous solution using the SiN thin film 3 as a mask to form an etched recess portion (a gate recess) 1a about 1000 Å deep as shown in FIG. 2(i).

Next, as shown in FIG. 3(a), the SiN thin film 3 is selectively side-etched by a predetermined amount L3 (equal to about 0.5 μm) with buffered hydrofluric acid in aqueous solution (hereinafter referred to as BHF solution) to form a SiN thin film enlarged aperture 3b wider than the WSi thin film aperture 4a. A part of the surface of the GaAs substrate 1 exposed in the SiN thin film enlarged aperture 3b is wet-etched with tartaric acid in aqueous solution as in the former process step using the side-etched SiN thin film 3 as a mask to form a gate recess 8 as shown in FIG. 3(b). The etching depth D2 is about 3000 Å.

Thereafter, Ti and Au are successively evaporated in thicknesses of 1000 Å and 8000 Å, respectively, as gate electrode materials on the entire surface to produce a T-shaped gate electrode 11a as shown in FIG. 3(c). The a position of the gate electrode leg part 11a₁ is determined by the WSi thin film aperture 4a, and the position of the gate electrode head part 11a₂ is determined by the photoresist film aperture 7a.

The gate electrode materials 11 on the photoresist film 7 are lifted-off by removing the photoresist film 7 as shown in FIG. 3(d). The WSi thin film 4 is selectively etched by RIE with a mixture of SF$_6$ and CHF$_3$ so that part 4b of the WSi thin film 4 adhering to the rear surface of overhanging portion of the T-shaped gate electrode head part 11a$_2$ remains as shown in FIG. 3(e). Further, the SiN thin film 3 is removed with BHF solution to complete the FET device 101 as shown in FIG. 3(f).

In the FET device 101, the height h1 from the first bottom surface 8a of the gate recess 8 to an upper surface of the WSi thin film 4b, i.e., the rear surface of overhanging portion of the gate electrode head part 11a$_2$, is about 5000 Å.

In the FET device of this embodiment having such a construction, since the WSi thin film 4b is integrally formed at the rear surface of overhanging portion of the gate electrode head part 11a$_2$ and the gate pad head part 11b$_2$, the mechanical strength at the junction of the gate electrode head part 11a$_2$ and the gate electrode leg part 11a$_1$ is increased. As a result, the gate electrode head part 11a$_2$ is hardly ever separated from the gate electrode leg part 11a$_1$, so that reliability is improved.

In the method of this embodiment, a source electrode and a brain electrode are produced on a GaAs substrate 1, a SiN thin film 3 and a WSi thin film 4 are deposited, a pattern of a T-shaped gate electrode leg part 11a$_1$ is transcribed to these thin films, the GaAs substrate surface is recess-etched using the patterned SiN thin film 3 as a mask, and gate electrode materials are evaporated using the patterned WSi thin film 4 as a mask. In short, the SiN thin film 3 and the WSi thin film 4 are used as a mask for producing the gate electrode leg part 11a$_1$, so that the distance from a bottom surface 8a of the gate recess 8 to the upper surface of the patterning mask for the gate electrode leg part is decreased. In this way, the T-shaped gate electrode is applicable to an FET device including a deep gate recess.

Since an image reversal resist film is adopted as a photoresist film 7 used as a mask for producing the gate electrode head part 11a$_2$, facing opposite surfaces of the patterned resist film 7 exposed in the resist aperture 7a are formed in overhanging configuration, resulting in an easy lifting-off of the gate electrode materials.

Since the fine pattern of the gate electrode leg part 11a$_1$ is transcribed to a photoresist film by a phase shift method, an EB resist film is not required, resulting in improved throughput.

After the etched recess portion 1a is formed, a predetermined amount of the SiN thin film 3 is selectively side-etched against the WSi thin film 4. Subsequently, a part of the semiconductor substrate surface exposed in the recess portion 1a is selectively wet-etched using the side-etched SiN film 3 as a mask to form the gate recess 8 having a two-stage recess structure comprising first and second bottom surfaces: the first bottom surface 8a is in contact with the gate electrode leg part 11a$_1$ while the second bottom surface 8b, not in contact with the gate electrode leg part 11a$_1$, is located beside both sides of the first bottom surface 8a in a higher position than the first bottom surface 8a. In this way, the gate recess 8 having the two-stage recess structure can be easily formed.

Embodiment 2.

FIGS. 4(a) to 4(i) are cross-sectional views illustrating process steps in another method for producing a semiconductor device according to a second embodiment of the present invention. In the figures, the same numerals as those in FIGS. 2(a) to 2(i) and FIGS. 3(a) to 3(f) designate the same or corresponding elements in the production process steps of the first embodiment. Reference numeral 12 designates a spin-on glass (SOG) film deposited on the entire surface by spin-coating after the gate recess 8 having the two-stage recess structure is produced. Reference numeral 12a designates a buried SOG layer in the gate recess 8. Reference numeral 12a$_1$ designates a SOG film aperture formed in the buried SOG layer 12a. The aperture 12a$_1$ has the same pattern as that of the aperture 4a of the WSi thin film 4.

Next, a description is given of a production method of the semiconductor device.

In this second embodiment, the process steps from the step of producing source and drain electrodes through the step of patterning SiN and WSi thin films using the photoresist film 5 as a mask are the same as those shown in FIGS. 2(a) to 2(f).

As shown in FIG. 4(a), after the photoresist film 5 for patterning the WSi thin film 4 and the SiN thin film 3 is removed, a part of the surface of the GaAs substrate 1 exposed in the SiN thin film aperture 3a is wet-etched using the patterned SiN thin film 3 as a mask to produce an etched recess portion 1a about 1000 Å deep.

Next, the SiN thin film 3 is selectively side-etched against the WSi thin film 4 by a predetermined amount L3 (equal to 0.5 μm) with BHF solution to form a SiN thin film enlarged aperture 3b which is wider than the WSi thin film aperture 4a as shown in FIG. 4(b). Successively, a part of the surface of a GaAs substrate 1 exposed in the SiN thin film enlarged aperture 3b is wet-etched with tartaric acid in aqueous solution using the side-etched SiN thin film as a mask to produce a gate recess 8 as shown in FIG. 4(c). Then, the etching depth is about 3000 Å as in the first embodiment.

Subsequently, a SOG film 12 5000 Å thick is deposited on the entire surface by spin-coating a silica system compound. SOG also fills the gate recess 8 as shown in FIG. 4(d) to form a SOG buried layer 12a.

RIE is carried out to the entire surface of the SOG film 12 using the WSi thin film 4 as a mask so as to leave portions of the buried SOG layer 12a under overhanging portion of the WSi thin film 4 in the gate recess 8 as shown in FIG. 4(e).

Ti and Au about 1000 Å and 800 Å thick, respectively, are evaporated on the entire surface as gate metals 11 to produce a T-shaped gate electrode 11a as in the first embodiment as shown in FIG. 4(f).

The gate electrode metals 11 are lifted-off by removing the photoresist film 7 as shown in FIG. 4(g), and then the WSi thin film 4 is selectively etched by RIE with a mixture of SF$_6$ and CHF$_3$ so that part 4b of the WSi thin film 4 adhering to the bottom surface of overhanging portion of the T-shaped gate electrode head part 11a$_2$ remains as shown in FIG. 4(h) as in the first embodiment. The SiN thin film 3 and the buried SOG layer 12a in the gate recess 8 are removed using BHF solution to complete an FET device 101 as shown in FIG. 4(i).

In the production method according to this second embodiment, a gate recess 8 is formed, SOG is filled in the gate recess 8 to form a buried SOG layer 12a, silicon oxide material is removed by etching using the WSi thin film 4 as a mask so that portions thereof under the WSi film 4 remains, and then, gate metals 11 are evaporated and lifted-off. In this way, in addition to the effects described in the first embodiment, an effect is obtained that the bottom surface of the gate recess 8 is prevented from being damaged by the SOG layer, even when SiN thin film 3 is etched, due to variations in the etching rate and the like, thereby resulting in the inner space of the gate recess 8 being exposed to RIE during the etching of the WSi thin film 4.

In addition, since SOG fills the gate recess 8, the filled layer in the gate recess 8 is prevented from being dissolved by the solution for dissolving the photoresist film 7 and from flowing out of the recess upon at depositing and developing the photoresist film 7, which is used as a mask for producing the gate electrode.

Embodiment 3.

FIGS. 5(a) to 5(j) are cross-sectional views illustrating process steps of another method for producing according to a third embodiment of the present invention. In FIGS. 5(a) to 5(j), the same reference numerals as those in FIGS. 2(a) to 2(i), 3(a) to 3(f) and 4(a) to 4(i) designate the same or corresponding elements as those in the first and the second embodiments. Reference numeral 13 designates a photoresist film deposited on the entire surface by spin-coating after the gate recess 8 having the two-stage recess structure is formed. Reference numeral 13a designates a buried photoresist layer in the gate recess 8. Reference numeral 13a₁ designates a buried resist layer aperture formed in the buried photoresist layer 13. The aperture 13a₁ has the same pattern as the aperture 4a of the WSi thin film 4. Here, a positive resist film is adopted as the photoresist film 13.

Next, a production method of the semiconductor device is described.

In a production method according to this third embodiment, process steps from the step of producing a source electrode and a drain electrode through the step of forming a gate recess 8 having the two-stage recess structure shown in FIGS. 2(a) to 2(f) and 5(a) to 5(c), are the same as those in the second embodiment.

After the gate recess 8 is formed as shown in FIG. 5(c), a photoresist film 13 about 1 μm thick is applied to the entire surface. Then, the gate recess 8 is filled with the photoresist to form the buried photoresist layer 13a as shown in FIG. 5(d).

The photoresist film 13 is exposed using the WSi thin film 4 as a mask and is developed, leaving part of the photoresist layer 13a under the overhanging portion of the WSi thin film 4 in the gate recess 8 as shown in FIG. 5(e).

As in the second embodiment, gate electrode materials are evaporated to produce a gate electrode 11a as shown in FIG. 5(f), and the gate materials 11 on the photoresist film 7 are lifted-off by removing the photoresist film 7 as shown in FIG. 5(g).

The WSi thin film 4 is selectively etched to leave part 4b thereof adhering to the bottom surface of overhanging portion of the T-shaped gate electrode head part 11a₂ as shown in FIG. 5(h). The SiN thin film 3 is removed with a BHF solution as shown in FIG. 5(i). At last, the buried resist layer 13a in the gate recess 8 is removed with an organic solvent to complete an FET device 101 having a T-shaped gate electrode as shown in FIG. 5(j).

In this third embodiment, after the gate recess 8 is formed, the gate recess 8 is filled with the photoresist film 13, the photoresist film 13 is exposed using the WSi thin film 4 as a mask and developed, and then the gate electrode materials are evaporated and lifted-off. In this way, in addition to the effects described in the first embodiment, the bottom surface of the gate recess 8 is prevented from being damaged by the photoresist layer 13a due to variations in the etching rate even when SiN thin film 3 is etched. The inner space of the gate recess 8 is not exposed to RIE during etching of the WSi thin film 4 by RIE.

Further, in this third embodiment, since the gate recess 8 is filled with the photoresist layer 13a, the buried photoresist layer 13a is patterned using the WSi thin film 4 as a mask, so that facing opposite surfaces of the patterned buried photoresist layer 13a can be approximately perpendicular to the substrate surface. In addition, patterning the buried resist layer 13a and removing the photoresist film 13 are carried out at the same time, resulting in simplified production process steps.

While when SOG is used as the filler of a gate recess as in the second embodiment, special equipment is required to form the SOG film, no special and large scale equipment is required in this third embodiment because photoresist is used as the filler.

Embodiment 4.

Figure 6:
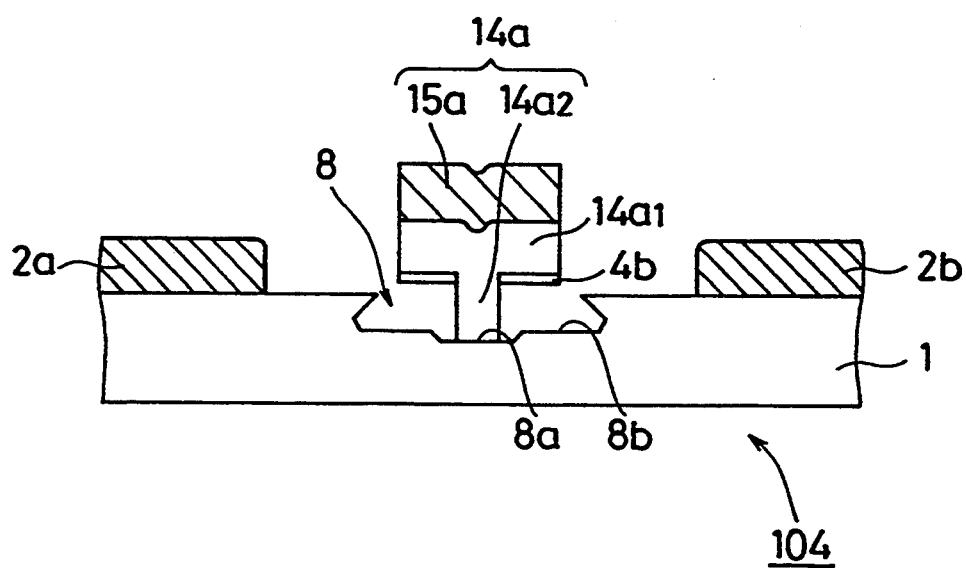
FIG. 6 is a cross-sectional view illustrating a structure of an FET device with a T-shaped gate electrode produced by another method for producing a semiconductor device in accordance with a fourth embodiment of the present invention.

FIG. 6 is a cross-sectional view illustrating a construction of an FET device obtained in a production method in accordance with a fourth embodiment of the present invention. FIGS. 7(a) to 7(g) illustrating main process steps in the production method.

In the figures, reference numeral 104 designates an FET device having a T-shaped gate electrode 14a obtained in this production method. The same reference numerals as those in FIGS. 1(a) to 1(c) designate the same or corresponding elements as those in the first embodiment. In the FET device 104, the gate electrode 14a includes a leg part 14a₂ and a lower head part 14a₁ comprising WSi, and an upper head part 15a comprising Au. Reference numeral 14 designates a WSi film as a gate electrode material deposited in a thickness of about 3000 Å on the entire surface. Reference numeral 15 designates an Au film as a gate electrode material deposited in a thickness of about 4000 Å on the WSi film 14. Numeral 16a designates a remaining part of a resist film 16 for patterning the Au film 15 and the WSi film 14, and the remaining part 16a is formed by exposing and developing the photoresist film 16 applied to the Au film 15. Here, WSiN can also be adopted as a gate material in place of WSi.

In a production method according to this fourth embodiment, process steps from the step of producing a source electrode and a drain electrode through the step of patterning a buried photoresist layer 13a in a gate recess 8, shown in FIGS. 2(a) to 2(f) and FIGS. 5(a) to 5(e), are the same as in the third embodiment.

Figure 7:
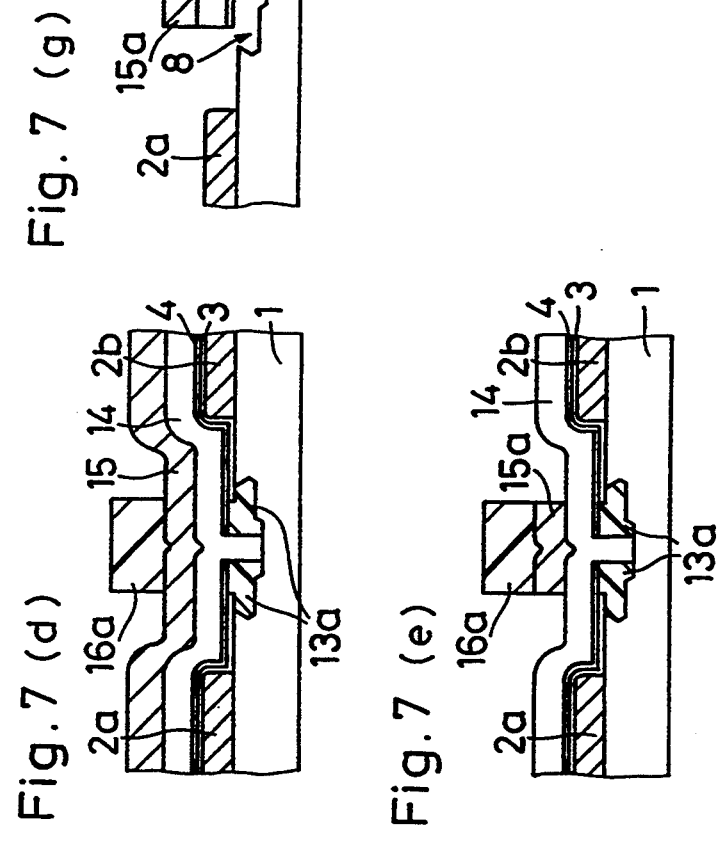
FIGS. 7(a) to 7(g) are cross-sectional views illustrating a method for producing semiconductor device in accordance with the fourth embodiment of the present invention.

After the buried photoresist layer 13a is patterned using the WSi thin film 4 as a mask as shown in FIG. 5(e), WSi is deposited in a thickness of 3000 Å on the entire surface by sputtering, and then Au is deposited in a thickness of 4000 Å on the entire surface of the WSi film 14 as shown in FIG. 7(b).

A photoresist film 16 is deposited on the entire surface of the Au film 15 as shown in FIG. 7(c). The photoresist film 16 is patterned to leave a remaining part 16a thereof on a part of the Au film 15 and the WSi film 14 which are to become a gate electrode head part as shown in FIG. 7(d).

Ion-milling is carried out to the entire surface using the remaining part 16a of the resist film as a mask to remove the Au film 15 except a portion thereof under the remaining part 16a of the resist film as shown in FIG. 7(e). RIE is carried out to the entire surface using the remaining part 16a of the resist film as a mask to remove the WSi film 14 except portion under the remaining part 16a of the resist film as shown in FIG. 7(f), to produce a T-shaped gate electrode 14a.

The remaining part 16a of the resist film and buried photoresist layer 13a in the gate recess 8 are removed with an organic solvent to complete an FET device 104 including a T-shaped gate electrode as shown in FIG. 7(g).

In this fourth embodiment, the fine aperture $13a_1$ of the buried resist layer 13a for producing the fine leg part $14a_2$ of the gate electrode 14a is filled by depositing WSi or WSiN as a gate electrode material on the entire surface by sputtering. Thus, a gate electrode material can completely fill a deeper aperture for producing a gate electrode leg part by sputtering than by evaporating, so that an effect is obtained that a T-shaped gate electrode 14a is stably produced in an FET device including a deeper gate recess than ever without an incomplete junction of the head part $14a_1$ with the leg part $14a_2$ in addition to the effects described in the third embodiment.

Since the upper head portion 15a of the T-shaped gate electrode comprises Au, an increase in the resistance at the T-shaped gate electrode 14a, which leg part $14a_2$ comprises WSi, is suppressed.

Here, although the T-shape gate electrode comprises a double-layer of a WSi layer and an Au layer, the T-shaped gate electrode can comprise a single WSi or WSiN layer.

Embodiment 5.

Figure 8:
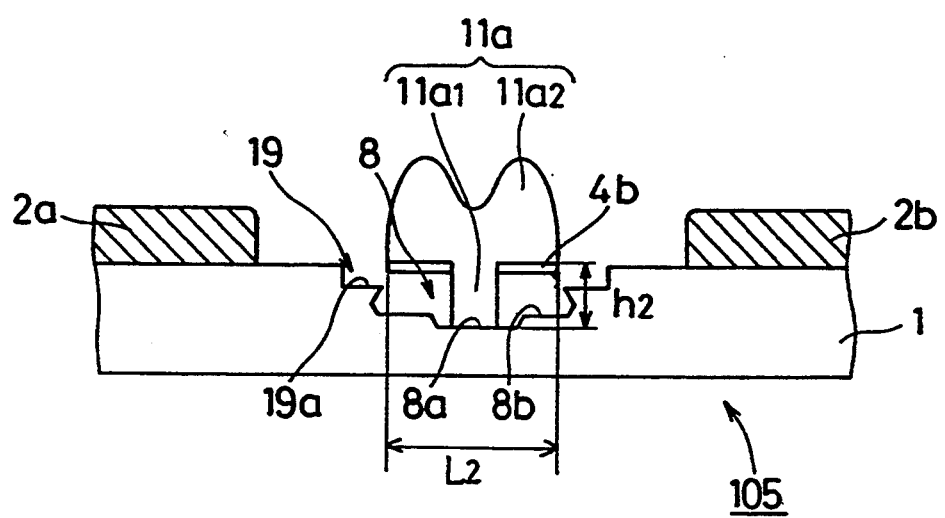
FIG. 8 is a cross-sectional view illustrating a structure of an FET device with a T-shaped gate electrode produced by another method for producing a semiconductor device as a fifth embodiment of the present invention.

FIG. 8 is a cross-sectional view illustrating a structure of an FET device obtained in a production method in accordance with a fifth embodiment of the present invention. FIGS. 9(a) to 9(i) and FIGS. 10(a) to 10(i) are cross-sectional views illustrating main process steps in the production method.

In FIG. 8, reference numeral 105 designates an FET device including a T-shaped gate electrode 11a produced according to the fifth embodiment. In the device 105, a gate recess 8, in which a T-shaped gate electrode 11a is disposed, is in a wide recess 19 formed between a source electrode 2a and a drain electrode 2b. Other structures of the FET device 105 are the same as those of the FET device 101 according to the first embodiment.

In FIGS. 9(a) to 9(i) and FIGS. 10(a) to 10(i), reference numeral 17 designates a photoresist film used as a mask in forming the wide recess 19. A width L3 of a resist aperture 17a of the photoresist film 17 is wider than a width L2 of a head part $11a_2$ of the T-shaped gate electrode 11a.

First, a source electrode 2a and a drain electrode 2b are produced on a GaAs substrate 1, a photoresist film 17 is deposited on the entire surface as shown in FIG. 9(a), and the photoresist film 17 is patterned by photolithography to form a photoresist film aperture 17a having a width L3 wider than a width L2 of a gate electrode head part $11a_2$, in a region between the source electrode 2a and the drain electrode 2b on a semiconductor substrate 1 as shown in FIG. 9(b).

The surface of the semiconductor substrate 1 is etched to a depth of 1000 Å using the photoresist film 17 as a mask to form a wide recess 19 as shown in FIG. 9(c). The width W2 of the bottom surface of the wide recess 19 is 2.0 μm.

Process steps, after the step of removing the photoresist film 17 as shown in FIG. 9(d) by side-etching a SiN thin film 3 (shown in FIGS. 9(e) to 9(i) and FIGS. 10(a) to 10(d)) are the same as those in the first embodiment shown in FIGS. 2(b) to 2(i) and FIG. 3(a).

A part of the surface of the GaAs substrate 1, exposed in the SiN thin film enlarged aperture 3b, is etched using the side-etched SiN thin film 3 as a mask to form a gate recess 8 as shown in FIG. 10(e). Then, the etching depth D3 is about 2000 Å, less than the etching depth D2 in the first embodiment by 1000 Å.

The same process steps as shown in FIGS. 3(c) to 3(f) of the first embodiment, i.e., evaporating gate electrode materials as shown in FIG. 10(f), lifting-off the gate electrode materials as shown in FIG. 10(g), selectively etching the WSi thin film 4 as shown in FIG. 10(h), and removing the SiN thin film 3 as shown in FIG. 10(i), are carried out to complete an FET device 105.

As described above, according to this fifth embodiment, since a gate recess 8 is formed in a wide recess 19 in a predetermined part of the surface of a GaAs substrate 1 between a source electrode and a drain electrode, if the depth from the top surface of GaAs substrate 1 to a bottom surface 8a of the gate recess is equal to that of the first embodiment, the depth of a gate recess 8 itself, i.e., the depth from the bottom surface 19a of the wide recess to the bottom surface 8a of the gate recess, is smaller than that of the first embodiment by 1000 Å, which is the depth of the wide recess.

Therefore, the length h2 of a leg part $11a_1$ of a T-shaped gate electrode 11a produced in a gate recess 8 is 4000 Å which is shorter than the length 5000 Å in the first embodiment by 1000 Å. As a result, a highly reliable T-shaped gate electrode having a high junction strength between a head part $11a_2$ and a leg part $11a_1$ of the T-shaped gate electrode 11a is obtained.

What is claimed is:

1. A semiconductor device comprising:
    a compound semiconductor substrate having a front surface and a rear surface opposite to said front surface; and
    a source electrode and a drain electrode disposed on said front surface of said compound semiconductor substrate;
    a gate electrode disposed on said front surface of said compound semiconductor substrate between said source and drain electrodes, said gate electrode having a T-shaped cross-section including a leg and a head overhanging said leg; and
    a gate pad having a T-shaped cross-section including a leg and a head overhanging said leg and disposed at one end of, connected to, and continuous with said gate electrode wherein said gate electrode and said gate pad include a reinforcing metallic film disposed on a rear surface of an overhanging portion of said gate electrode head and said gate pad head opposite and spaced from said compound semiconductor substrate.

2. The semiconductor device of claim 1 wherein no solid material is present between said reinforcing metallic film and said front surface of said compound semiconductor substrate.

3. The semiconductor device of claim 1 wherein said compound semiconductor substrate includes at said front surface a gate electrode recess, said leg of said gate electrode contacting said compound semiconductor substrate in the gate recess, and a gate pad recess in the front surface of said compound semiconductor substrate transverse to and continuous with the gate electrode recess, said leg of said gate pad contacting said compound semiconductor substrate in the gate pad recess.

4. The semiconductor device of claim 1 wherein said compound semiconductor substrate includes at said first surface a first gate electrode recess and a second gate electrode recess within the first gate electrode recess, said leg of said gate electrode contacting said compound semiconductor substrate in the second gate electrode recess.

5. The semiconductor device of claim 1 wherein said gate electrode and said gate pad include two successively disposed metallic materials.

6. The semiconductor device of claim 5 wherein said legs and part of said heads of said gate electrode and said gate pad comprises a refractory metal silicide and another part of said heads of said gate electrode and said gate pad comprises a low resistance metal.

7. The semiconductor device of claim 6 wherein said refractory metal silicide is tungsten silicide and said low resistance metal is gold.

8. The semiconductor device of claim 5 wherein said legs and part of said heads of said gate electrode and said gate pad comprises titanium and another part of said heads of said gate electrode and said gate pad comprises gold.

9. The semiconductor device of claim 1 wherein the reinforcing metallic film is tungsten silicide.

* * * * *